(12) United States Patent
Cheng

(10) Patent No.: US 11,538,520 B1
(45) Date of Patent: Dec. 27, 2022

(54) NEGATIVE-CAPACITANCE FERROELECTRIC TRANSISTOR ASSISTED RESISTIVE MEMORY PROGRAMMING

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 17/482,491

(22) Filed: Sep. 23, 2021

(51) Int. Cl.
*G11C 11/22* (2006.01)
*G11C 13/00* (2006.01)

(52) U.S. Cl.
CPC ........ *G11C 13/0026* (2013.01); *G11C 11/221* (2013.01); *G11C 11/223* (2013.01); *G11C 13/0028* (2013.01); *G11C 2213/79* (2013.01)

(58) Field of Classification Search
CPC . G11C 13/0026; G11C 11/221; G11C 11/223; G11C 13/0028; G11C 2213/79
See application file for complete search history.

(56) References Cited

U.S. PATENT DOCUMENTS 10,128,327 B2 11/2018 Zhang
10,170,520 B1 1/2019 Frougier et al.
(Continued)

FOREIGN PATENT DOCUMENTS

WO 2019/005002 A1 1/2019

OTHER PUBLICATIONS

B. Traoré et al., "Investigation of the role of electrodes on the retention performance of HfOx based RRAM cells by experiments, atomistic simulations and device physical modeling," 2013 IEEE International Reliability Physics Symposium (IRPS), Anaheim, CA, 2013, pp. 5E.2.1-5E.2.6. doi: 10.1109/IRPS.2013.6532041.
(Continued)

*Primary Examiner* — Khamdan N. Alrobaie
(74) *Attorney, Agent, or Firm* — Scully, Scott, Murphy & Presser, P.C.; Samuel A. Waldbaum

(57) ABSTRACT

A memory device is provided that includes at least one resistive memory cell, a negative capacitance field effect transistor (NC-FET) serving as a voltage amplifier, and a switch enable circuit connecting NC-FET to the memory cell. The NC-FET includes a regular FET having a metal gate terminal and a ferroelectric capacitor. The NC-FET gate terminal forms one plate of the ferroelectric (FE) capacitor. The ferroelectric capacitor includes a ferroelectric dielectric material deposited between a formed upper gate conductive contact and he metal gate terminal. To provide further flexibility, a metal layer can be deposited before the deposition of the ferroelectric material to form a MIM-like FE capacitor so that the capacitance of FE capacitance can be independently tuned by choosing the right height (H), width (W), and length (L) to achieve desired matching between $|C_{FE}|$ and $C_{ox}$ where $C_{ox}$ is the gate oxide capacitance and $C_{FE}$ is the ferroelectric capacitance.

20 Claims, 14 Drawing Sheets

(56) References Cited

U.S. PATENT DOCUMENTS

| | | |
|---|---|---|
| 10,475,514 B2 | 11/2019 | Li et al. |
| 10,600,808 B2 | 3/2020 | Schroeder |
| 10,861,968 B1 | 12/2020 | Young et al. |
| 2016/0005749 A1* | 1/2016 | Li .......................... H01L 28/56 |
| | | 257/295 |
| 2019/0074295 A1 | 3/2019 | Schroeder |
| 2019/0096767 A1* | 3/2019 | Yeh ................. H01L 21/823462 |
| 2020/0176585 A1 | 6/2020 | Young et al. |
| 2020/0202202 A1 | 6/2020 | Chava et al. |
| 2021/0028178 A1* | 1/2021 | You .................... G11C 14/0072 |

OTHER PUBLICATIONS

Via, T. P., FEDRAM: A Capacitor-less DRAM Based on Ferroelectric-Gated Field Effect Transistor, IEEE International Memory Workshop (IMW), May 2014, pp. 1-4.
Li et al., "Sub-60vM-Swing negative-Capacitance FinFET without Huysteresis", Conference Paper, Dec. 2015, pp. 1-5DOI: 10.1109/IEDM.2015.7409760.

\* cited by examiner

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

US 11,538,520 B1

NEGATIVE-CAPACITANCE FERROELECTRIC TRANSISTOR ASSISTED RESISTIVE MEMORY PROGRAMMING

BACKGROUND

The present application relates to a memory device and a method of forming the same.

More particularly, the present application relates to an array of memory cells and a method to reduce the operating voltage of a memory cell.

While nonvolatile memory such as resistive random access memory (RRAM) has emerged as a viable device for storage and analog computing, e.g., especially due to its compatibility for CMOS logic processing, the forming process requires a high voltage which requires charge pumping. There is a need for performing the forming process even at a nominal voltage.

SUMMARY

The present application provides a method and structure for forming a RRAM by using a negative-capacitance ferroelectric transistor (NC-FET) to enable the forming process of RRAM at a nominal voltage.

In particular, there is provided a RRAM array with an NC-FET that enables the reduction of RRAM array size by providing an NC-FET to function as a charge pumping circuit and that enables RRAM operation at a nominal Vdd voltage.

According to one aspect, there is provided a memory device comprising: at least one memory cell; a negative capacitance field effect transistor (NC-FET) functioning as a voltage amplifier circuit for generating an amplified voltage from a received voltage; and a switch circuit connecting a gate terminal of the NC-FET to the at least one memory cell for conducting the amplified voltage to the at least one memory cell.

According to a further aspect, there is provided a memory cell array comprising: a plurality of memory cells, one or more memory cells of the plurality accessible to store data in and output data from the memory cell; a negative capacitance field effect transistor (NC-FET) functioning as a voltage amplifier circuit for generating an amplified voltage from a received voltage; and a switch circuit connecting a gate terminal of the NC-FET to the one or more memory cells for conducting the amplified voltage to the one or more memory cells.

Yet in another aspect, there is provided a method of forming a memory device. The method comprises: forming on a substrate at least one resistive memory cell; forming on the substrate an NC-FET serving as a voltage amplifier; and forming on the substrate an enable switch circuit configurable to conduct an amplified voltage from said NC-FET to said at least one resistive memory cell.

DETAILED DESCRIPTION

Figure 1A:
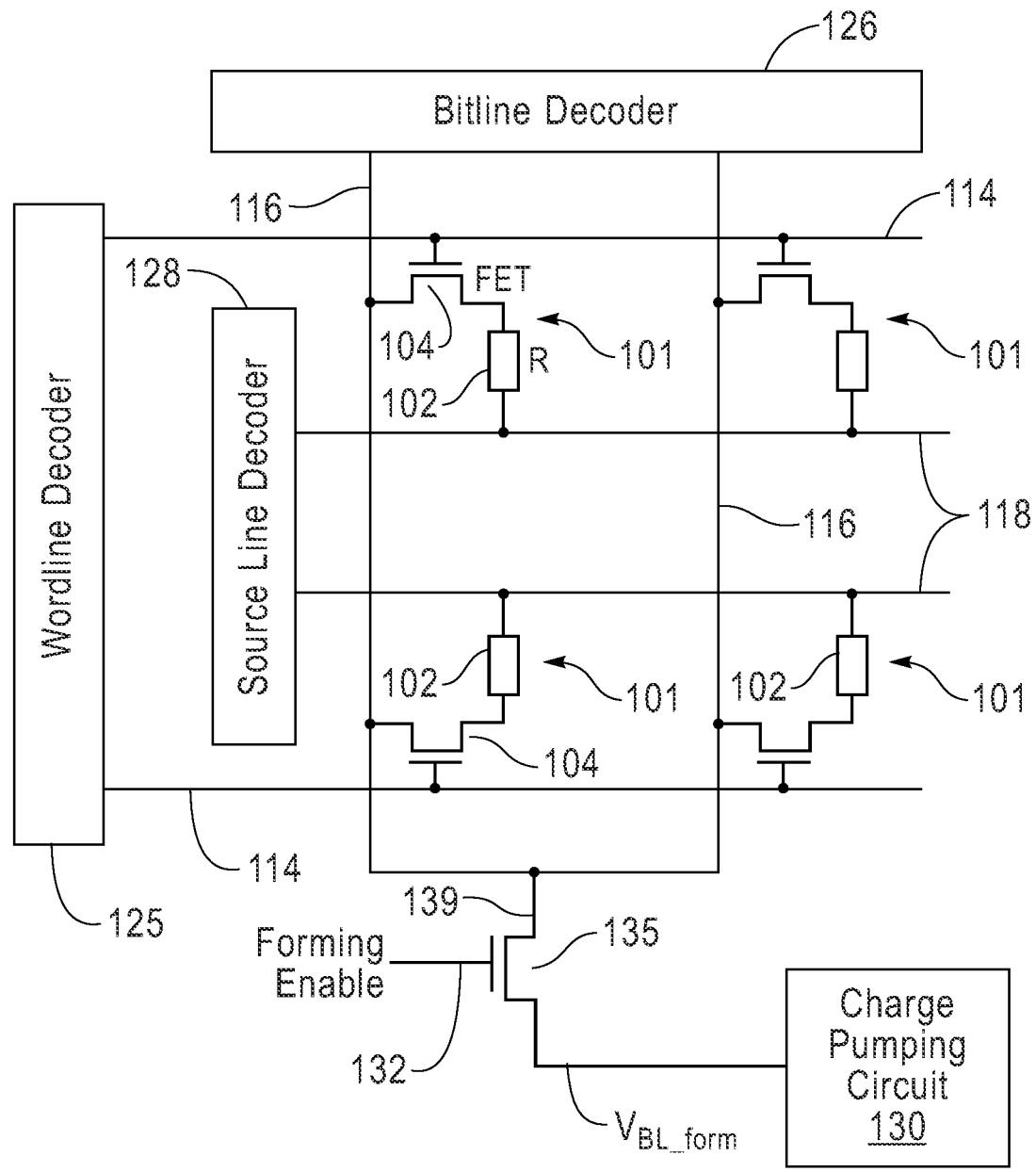
FIG. 1A depicts a circuit diagram of a RRAM cell array including a conventional charge pump circuit used to provide a voltage boost to a nominal voltage signal for application to the array via a forming enable transistor in order to program the selected RRAM cell.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
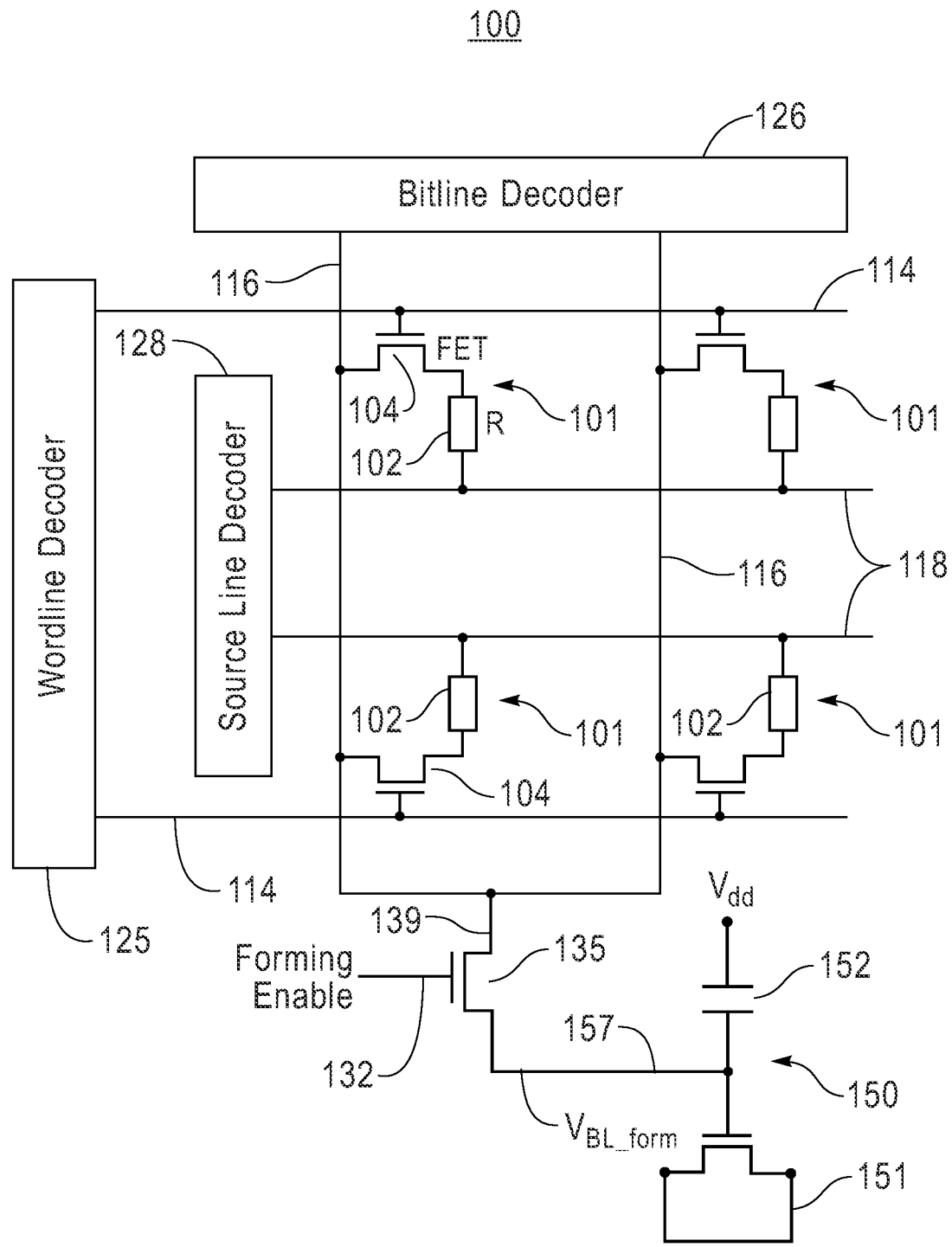
FIG. 1B depicts a circuit diagram of a RRAM cell array including an NC_FET device used to provide a voltage boost to a nominal voltage signal for application to the array via a forming enable transistor when programming selected RRAM cells to a Low Resistance State during a "forming" operation according to an embodiment.
Figure 2:
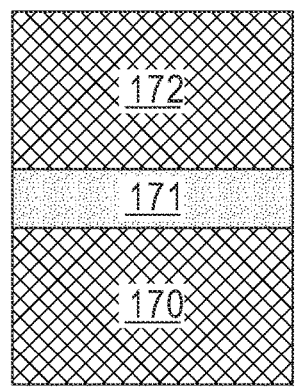
FIG. 2 shows a resistive (memory storage) element of a RRAM storage device according to an embodiment.

Referring first to FIG. 1B, there is illustrated an exemplary diagram of a nonvolatile random access memory—in particular, a Resistive Random Access Memory (ReRAM or RRAM) array 100 including a RRAM cell 101 configured to store a memory bit value corresponding to a low resistance cell state (e.g., a logic 1 value) or a high resistance cell state (e.g., a logic 0 value). Each RRAM cell 101 includes an access transistor (FET) 104 and a resistive element R 102, i.e., RRAM storage device. Such resistive element 102 can include an oxide, e.g., a transition metal oxide, and as shown in FIG. 2, is formed as a stack including a top metal electrode 172, a bottom metal electrode 170 and a middle layer of oxide material, e.g., $HfO_2$. In embodiments, the storage cell metal electrodes can include materials such as Pt, TiN, Ti, Ru, Ni, TaN, W, etc. deposited by physical vapor deposition (PVD) processes while the middle layer 171 of transition metal oxide material such as, $HfO_x$, $TiO_x$, $NiO_x$, $WO_x$, $TaO_x$, $VO_x$, $CuO_x$, etc. can be deposited by atomic layer deposition (ALD) processes.

For illustrative purposes, the RRAM array 100 shown in FIG. 1B, is a 2×2 array structure however it is understood that the principles herein are applicable to any n×m RRAM array structure. In the embodiment depicted in FIG. 1, each RRAM memory storage cell 101 is shown connected to a wordline decoder 125 providing a plurality of wordlines 114, a bitline decoder 126 providing a plurality of bitlines 116 and a sourceline decoder 128 providing a plurality of sourcelines 118.

In the embodiment shown, each RRAM memory storage cell 101 is electrically connected at the intersection of a wordline 114 and a respective bitline 116. In particular, a wordline 114 selects a row of the RRAM array by electrically connecting to a gate terminal of each access transistor 104 along a row to enable access to a terminal of each of a plurality of RRAM storage cells "R" 102 along that row. A drain (or source) terminal of the access FET 104 is connected to a first terminal of the RRAM cell 102, while the second terminal of the RRAM cell 102 electrically connects to a sourceline 118. The other source (or drain) terminal of the access FET 104 is connected to the intersecting bitline.

In a general operation, a wordline decoder 125 provides the voltage to the gate of the corresponding access FETs to turn on the access FETs (select which row 114 of cells 101 is to be read or written to) or turn off the corresponding access FETs (to de-select the corresponding row). The bitline decoder 126 and/or sourceline decoder 128 cooperatively interact to either read each of the bits of the connected RRAM storage cells on that wordline or it applies a current to program the bit to be stored at the respective selected resistive element 102 of the RRAM cell 101. In particular, a stored bit at a resistive element 102 corresponds to either the high-resistance cell state or a low-resistance cell state. The combination of the bitline decoder and the source decoder, in conjunction with the wordline decoder, selects a specific memory cell to program or to read. For example, when the access FETs are n-type and the RRAMs are bidirectional, to perform a SET operation, a voltage higher than the threshold voltage of the FETs, the FETs are on. The sourceline can be grounded and a positive voltage can be applied to the bitline higher than the SET voltage. To perform a RESET operation, the bitline can be grounded and a positive voltage is applied to the sourceline higher than the RESET voltage. To read a cell, the sourceline can be grounded and a small voltage can be applied to the bitline to sense the current which read out the resistance of the RRAM cell.

As known from the reference to B. Traoré et al. entitled "Investigation of the role of electrodes on the retention performance of HfOx based RRAM cells by experiments, atomistic simulations and device physical modeling," 2013 *IEEE International Reliability Physics Symposium (IRPS)*, Anaheim, Calif., 2013, pp. 5E.2.1-5E.2.6. doi: 10.1109/IRPS.2013.6532041, various operations govern the RRAM resistive element device behavior, i.e., govern the memory bit value to be stored. As shown in the current-voltage (I-V) curves of FIG. 3A and FIG. 3B, a first operation is a "forming" operation in which an applied voltage across the device exceeds a certain level, i.e., a forming voltage, and the RRAM responsively starts changing its state from HRS to LRS. The maximum current of the RRAM device is constrained by a current limiter, e.g., a transistor. Thus, a first state of most RRAM devices is a High Resistance State (HRS), in which the RRAM resistance is considered higher than a specific value. The first operation to turn the RRAM device to the Low Resistance State (LRS) is the "forming" operation. LRS means that the RRAM resistance is less than a certain value. The LRS resistance is preferred to be smaller than the HRS resistance by a sufficient amount so that a supporting circuit is able to discern the RRAM state unambiguously. The forming operations involve a process requires a high voltage which requires charge pumping.

Figure 3A:
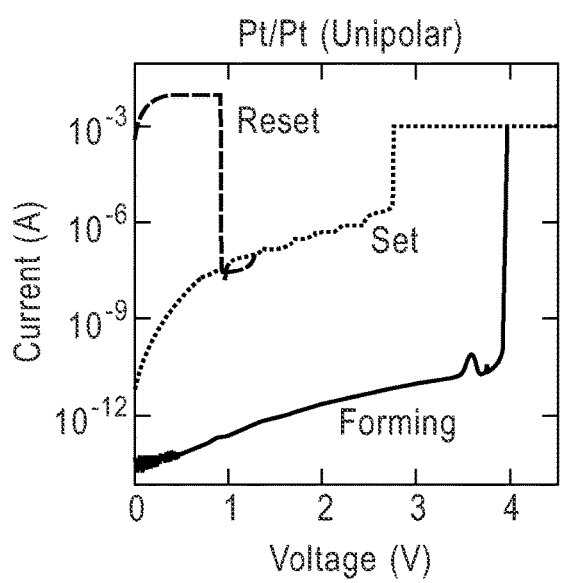
FIGS. 3A and 3B show respective current-voltage (I-V) curves corresponding to resistive state changing SET/RE-SET and "forming" operations of the resistive element of FIG. 2 for the case of a unipolar device (FIG. 3A) and a bipolar device (FIG. 3B)
Figure 3B:
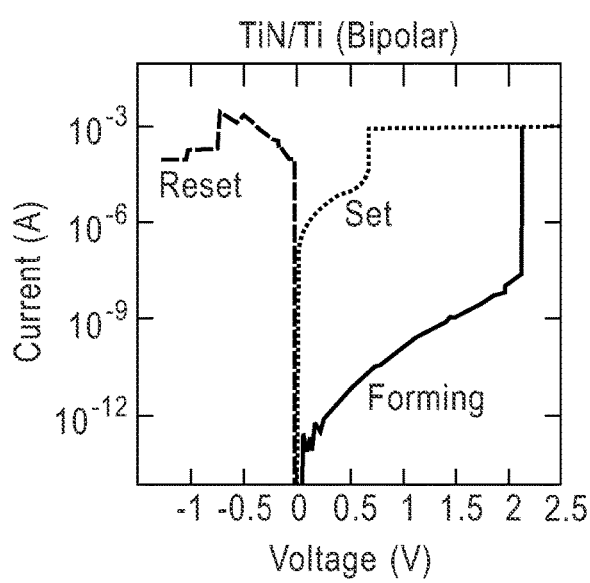

After the forming operation in which the RRAM devices are rendered into a LRS, to transition the RRAM device operation between low resistance and high resistance states, a reset operation is performed in which the applied voltage across the device sweeps negatively and upon exceeding a certain "reset" voltage limit, the RRAM device will change the state from LRS back to HRS. This process is called a RESET operation as illustrated in FIGS. 3A, 3B. When the voltage changes to positive again and exceeds another "set" voltage limit, the RRAM will change its state from HRS to LRS. This process is called a SET operation as illustrated in FIGS. 3A, 3B. The RRAM device can be worked back and forth between HRS and LRS by respective RESET and SET operations wherein a sufficiently low negative voltage RESETs the device, and a sufficiently high positive voltage can SET the device. If the polarity of the "reset" voltage is different from that of the "set" voltage (and forming voltage), the RAM device is called a bipolar-switching device as shown in FIG. 3B; otherwise, it is called a unipolar device (FIG. 3A). For most RRAM devices, the forming operation applies a higher forming voltage, $V_{FORMING}$, (>set voltage) to induce the transition from HRS to LRS.

In an embodiment, the RRAM memory cell device 101 cell can be programmed from between a HRS and a LRS by respective RESET and SET operations. To program the RRAM device to a low resistance state via a SET operation in the RRAM array 100, an access transistor 104 of the selected RRAM cell 101 is turned on. The connected bit line 116 is applied with a set voltage, e.g., $V_{SET}$, and the selected source line 118 is grounded to program the cell to a LRS. To RESET the selected RRAM cell, the connected bit line 116 is grounded and the selected source line 118 is applied with a positive voltage $V_{RESET}$.

As mentioned, the RRAM cell forming operation applies a higher forming voltage, $V_{FORMING}$, (greater than set voltage, $V_{SET}$) to induce the transition from HRS to LRS. In a prior art design shown in FIG. 1A, a charge pump circuit 130 receives a nominal supply voltage and generates a voltage boost, i.e., a $BL\_V_{FORM}$ voltage, that is applied to one or more bitlines 116 via a forming enable transistor 135 in order to program the selected RRAM cell to the Low Resistance State during the "forming" operation. In an operation, a "forming_enable" control signal 132 is applied to the gate of the forming enable transistor 135 in order to conduct the boosted $BL\_V_{FORM}$ voltage to the connected bitlines 116 in order to initially program the connected respective RRAM resistive memory cells 102 to the LRS.

In accordance with one embodiment, as shown in FIG. 1B, connected to the bitlines 116 is a negative-capacitance ferroelectric transistor (NC-FET) 150 to enable the "forming" process of selected RRAM at a nominal voltage. The NC-FET 150 serves as a voltage amplifier to boost the applied nominal supply voltage Vdd. That is, in an embodiment, the NC-FET 150 has a gate voltage of nominal operation voltage (e.g., Vdd) with the source/drain terminals are grounded.

The NC-FET is integrated with the RRAM array 100 so that a single NC-FET 150 can be used for multiple RRAM cells, for example, all RRAM cells sharing the same bitline 116 (or source line 118), or an entire RRAM array. In a typical RRAM application, the "forming" operation is the first step of programming a RRAM cell and it is done only once. Therefore, a single NC-FET can be used to enable a forming voltage that is greater than the nominal operation voltage and applied to all RRAM cells in the same array. By turning on all access FETs in the array, the entire RRAM can be subjected to the "forming" operation simultaneously. As shown in FIG. 1B, the NC-FET 150 includes a Metal-Oxide-Semiconductor Field-Effect-Transistor (MOSFET) transistor 151 with its gate in series with a ferroelectric capacitor 152. During normal operation (e.g., when applying SET/RESET to RRAM cells), the Forming_Enable FET 135 is turned off to disconnect the NC-FET from RRAM array 100. Otherwise, enable FET 135 is responsive to enable signal 132 asserted to turn on the enable FET 135 and configure FET 135 to conduct the boosted nominal supply voltage generated by the NC_FET 150 via gate conductor 157 to a common terminal connecting one or multiple bitlines 116. Thus, corresponding one or more memory cells can be programmed with the forming_enable voltage sufficient to render the memory cells in the LRS.

Figure 4:
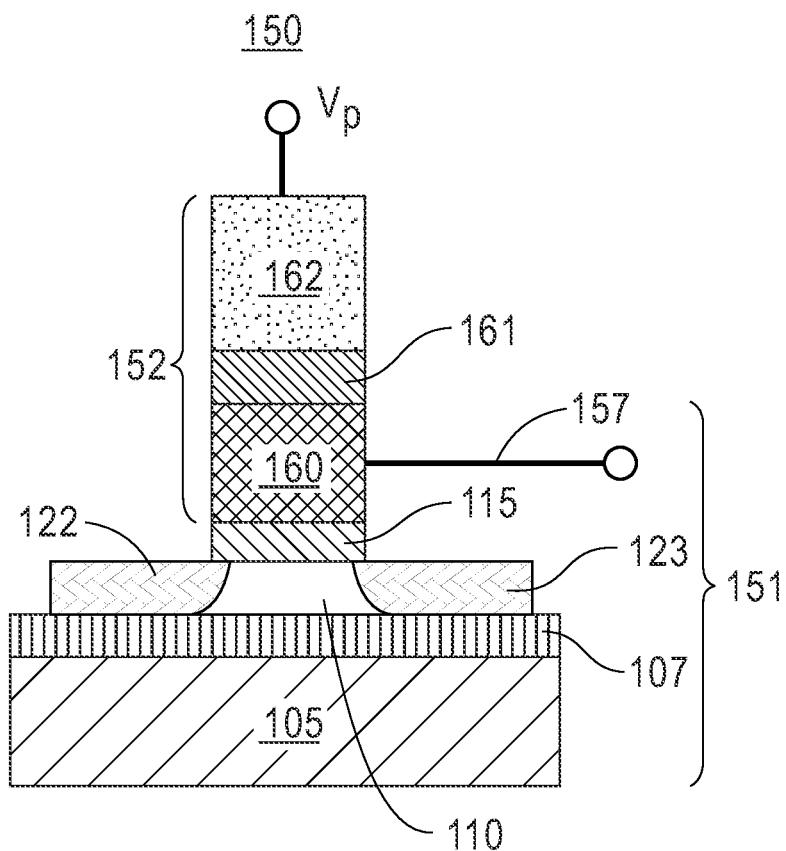
FIG. 4 shows a cross-sectional view of an exemplary NC-FET structure, in particular, a MOSFET with its gate in series of a ferroelectric capacitor.

FIG. 4 shows a cross-sectional view of an exemplary NC-FET structure 150, in particular, a MOSFET 151 with its gate 160 in series of a ferroelectric capacitor 152.

MOSFET 150 can include a gate conductor 160, a source region 122 and a drain region 123, which are highly conducting doped semiconductor regions (e.g., doped n-type regions in an n-type MOSFET or p-type in a p-type MOSFET device) that are isolated from an oppositely doped semiconductor substrate105 (e.g., doped p-type in an n-type MOSFET or doped n-type in a p-type MOSFET) by a thin buried dielectric material layer such as oxide layer 107. As shown, separating the source region and drain region is a semiconductor channel region110 via which negatively charged electrons flows responsive to applied voltages at the gate terminal and drain terminal relative to the source terminal. In an embodiment, the gate is a metal (or polycrystalline) electrode layer that is formed above the semiconductor channel region 110 between source and drain, but is separated from the channel 110 by a thin gate dielectric layer such as an oxide layer 115. In an embodiment, the gate oxide layer 115 is hafnium oxide and can include an interfacial oxide.

In the embodiment of the NC-FET 150 depicted in FIG. 4, the metal gate electrode160 also functions as one plate of the ferroelectric capacitor 152. That is, the ferroelectric capacitor 152 includes a first capacitor terminal (a metal plate), i.e., the gate electrode 160, and a second capacitor terminal (e.g., a metal plate) 162 separated by a thin ferroelectric material layer 161 to provide a negative capacitance. The ferroelectric material includes any ferroelectric/dielectric material, e.g., lead titanate ($PbTiO_3$), lead zirconate titanate (PZT), lead lanthanum zirconate titanate (PLZT), lead magnesium niobate (PMN), barium titanate ($BaTiO_3$), pervoskites, and (FE) Hf-based dielectrics, e.g., hafnium zirconium oxide (HfZrOx) and the like.

As shown in FIG. 4, in circuit operation, a programming voltage, $V_p$, is applied the second metal terminal 162 of the ferroelectric capacitor 152. Due to the negative capacitance of the ferroelectric, the effective gate voltage across the gate oxide ($V_g$) becomes higher than the programming voltage, $V_p$. This gate voltage is output from the NC-FET 150 at a terminal or conductive contact 157 and in accordance with embodiments herein, is conducted to one or more RRAM resistive memory cells of array 100, particularly when programming the connected respective memory cells 102 to the LRS at bitlines that the cells are connected with.

Figure 5:
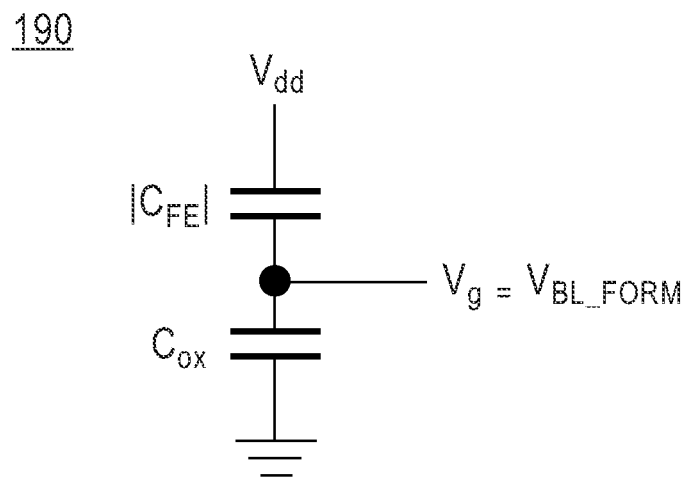
FIG. 5 shows a corresponding circuit schematic of the negative capacitance exhibited by the NC-FET structure according to an embodiment.

In a circuit schematic 190 of FIG. 5 corresponding to the NC-FET 150 of FIG. 4, due to the negative capacitance of the ferroelectric capacitor, the effective gate voltage $V_g$ across the gate oxide is higher than the programming voltage, $V_p$, where $V_p = V_{dd}$. In other words, the applied Vdd voltage is amplified by the ferroelectric capacitor to form the effective gate voltage, and hence the forming voltage applied to the RRAM cells, i.e., $V_g = V_{BL\_FORM}$ applied during the RRAM array memory cell forming operations. In view of the corresponding circuit depiction of FIG. 5, a voltage gain, Av, exhibited by the NC-FET 150 is computed according to:

$$(Av) = V_g/V_{dd} = |C_{FE}|/(|C_{FE}| - C_{OX}) = 1/(1 - C_{OX}/|C_{FE}|)$$

where $C_{OX}$ is the gate dielectric capacitance value and $|CFE|$ is the absolute value of ferroelectric capacitance. As an example, in view of the circuit depiction of FIG. 5, given the relation governing capacitance, i.e., $$C = k \times A/t$$

where A is the area of the plates/terminals and t is the distance between them and k is the permittivity of the dielectric material between the plates of the gate oxide capacitor, and given a gate oxide layer 115 of a thickness about 1.8 nm, e.g., a high-k gate dielectric layer (e.g., hafnium oxide) and an 0.8 nm thick interfacial oxide layer, a ferroelectric dielectric of about 5 nm thick, a dielectric constant of $HfO_2$ of about 20, there results in a $|C_{OX}|/|C_{FE}|$ value of about 0.8, yielding an Av=7.4, i.e., 7.4× voltage gain. Thus, for example, given a $V_p = V_{dd}$ (normal supply voltage) of about 0.6V results in a $V_g$ (voltage across gate oxide) 4.4V. This $V_g$ becomes the $V_{BL\_FORM}$ forming voltage applied during the RRAM array memory cell forming operations.

Returning to FIG. 1B, the forming voltage ($V_{BL\_form}$) is greater than Vdd due to the NC-FET 150. During forming operation, $V_{BL\_form}$ is passed to all bitlines by turning on the Forming_Enable FET 135 (or any other pass-gate like device). All wordlines are on and source lines are grounded. All RRAM cells receive high $V_{BL\_form}$ and are formed simultaneously. During normal operation (SET/RESET), the Forming_Enable FET 132 is turned off to disconnect the NC-FET from RRAM array.

Figure 6:
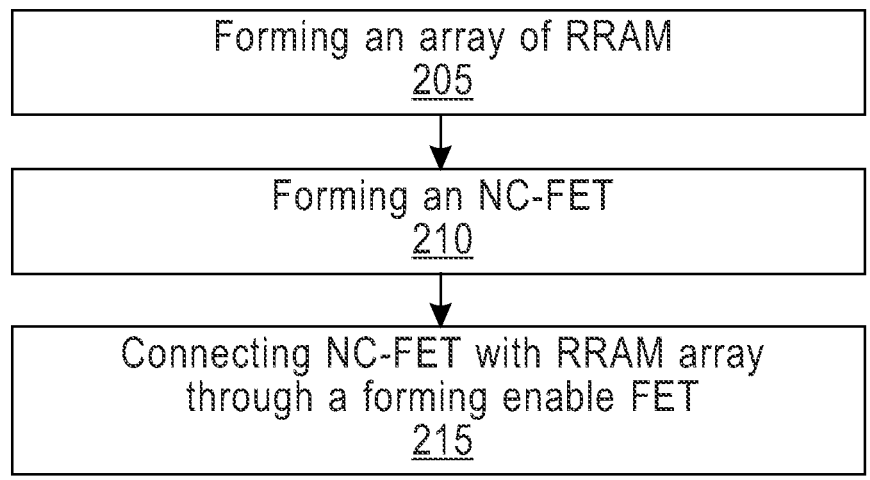
FIG. 6 depicts a method for forming a negative-capacitance ferroelectric transistor (NC-FET) used to enable the "forming" process of RRAM at a nominal voltage.

FIG. 6 depicts a method 200 for forming the RRAM memory storage array including a negative-capacitance ferroelectric transistor (NC-FET) used to enable the "forming" process of RRAM at a nominal voltage. As shown, at 205, there is depicted steps of forming an ReRAM (RRAM) memory array, such as the RRAM array 100 shown in FIG. 1B, for storage and analog computing that can be formed by techniques that are well known in the art. Then, at 210 semiconductor manufacturing steps are performed to form the NC-FET such as the NC-FET 150 shown in FIG. 4. Then, at 215, semiconductor manufacturing steps are performed to form the conductive line connecting NC-FET 150 to plural bitlines of the RRAM array through a forming enable FET 135.

Figure 7:
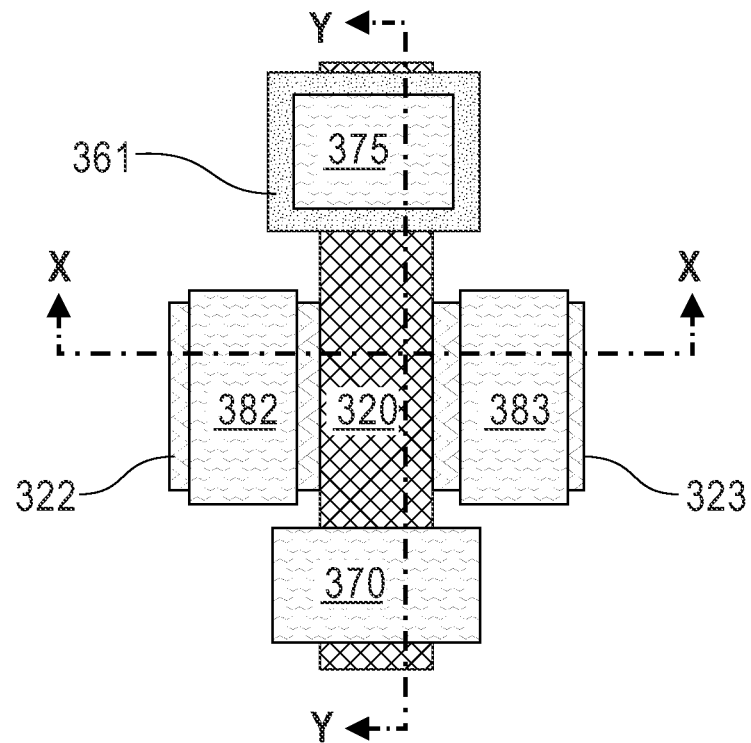
FIG. 7 depicts a top-down view of a first exemplary NC-FET structure that is used to provide the RRAM array forming voltage.

FIG. 7 depicts a top-down view of the physical NC-FET structure 300 of a first embodiment corresponding to the NC-FET structure 150 of FIG. 4 that is used to provide the RRAM array forming voltage. The NC-FET structure 300 results from the NC-FET processing steps of FIGS. 8A-8H. The formed NC-FET structure of the first embodiment includes a MOSFET transistor 300 having metal gate 320, source terminal 322 and respective source terminal contact 382, drain terminal 323 and respective drain terminal contact 383 all formed on a substrate formed using semiconductor manufacturing techniques as known in the art. In particular, the NC-FET can be formed by standard CMOS flow and then followed by standard middle-of-line (MOL) contact formation which results in the formed source contact 382, drain contact 383, a first gate contact 370 and a second gate contact 375. As shown in FIG. 7, the second gate contact 375 forms a terminal (e.g., plate) of a ferroelectric capacitor having a deposited ferroelectric material layer 361.

FIGS. 8A-8H depict the semiconductor manufacturing steps performed to form the NC-FET 300 of the first embodiment as shown in FIG. 7.

Figure 8A:
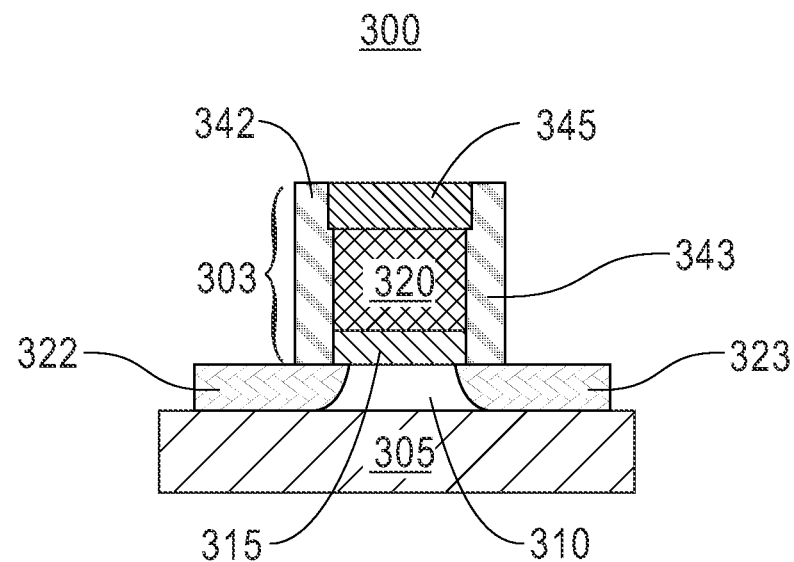
FIGS. 8A-8H depict the semiconductor manufacturing steps performed to form the NC-FET of the first embodiment as shown in FIG. 7.
Figure 8B:
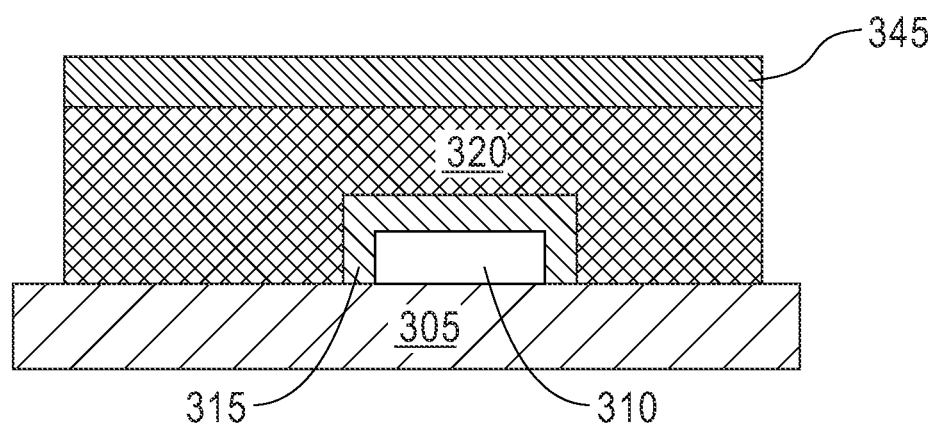

FIG. 8A shows a view taken along an X-X cross-section of the formed MOSFET transistor 300 formed using semiconductor manufacturing techniques. FIG. 8B shows a view taken along a Y-Y cross-section of the formed MOSFET transistor 300 of FIG. 8A. More particularly, the cross-sectional view of the formed MOSFET transistor 300 of FIG. 8A is taken along the X-X axis of the corresponding layout view of FIG. 7. The corresponding cross-sectional view of the formed MOSFET transistor 300 of FIG. 8B is taken along the Y-Y axis of the corresponding layout view of FIG. 7.

The MOSFET transistor 300 of FIG. 8A includes, formed on a semiconductor substrate 305, a gate "stack" 303 including a metal gate terminal 320, a gate dielectric layer 315, and a gate dielectric cap layer 345 formed between a dielectric spacer elements 342, 343; and further includes a source terminal region 322, a drain terminal region 323, and situated therebetween a semiconductive channel 310 overlying the substrate 305. In other embodiments, the gate dielectric cap layer 345 are omitted.

With more particularity, in FIG. 8A, the formed MOSFET transistor 300 includes a bulk semiconductor substrate 305 that may include a semiconductor material or a stack of semiconductor materials such as, for example, Si, Ge, SiGe, SiC, SiGeC, Ge alloys, GaAs, InAs, InP as well as other III/V or II/VI compound semiconductors. In one embodiment, the bulk semiconductor substrate includes a single crystalline semiconductor material such as, for example, single crystalline silicon. The thickness of the bulk semiconductor substrate can be from 30 µm to about 2 mm, although lesser and greater thicknesses can also be employed. The bulk semiconductor substrate may be doped with dopants of p-type or n-type. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The dopant concentration in the bulk semiconductor substrate can range from $1 \times 10^{14}$ atoms/cm$^3$ to $3 \times 10^{17}$ atoms/cm$^3$.

In an embodiment, an upper portion of the bulk semiconductor substrate can be used as the channel material layer 310. In another embodiment, the bulk semiconductor substrate can include the channel material layer 310 and at least one other semiconductor material. Channel material layer 310 may comprise a homogenous material including one of the same elements mentioned above, or may be a heterogeneous structure in which at least two different elements mentioned above are stacked on top of each other. The channel material layer 310 can have any known crystal orientation including, for example, (100), (110), (111) and the like. The first semiconductor layer 14 may be unstrained, strained or a combination of strained and unstrained. The thickness of the channel layer 310 may vary from about 3 to about 100 nm.

Alternatively, a semiconductor-on-insulator substrate can be used in place of the bulk semiconductor substrate shown in FIG. 8A. In embodiments, the semiconductor-on-insulator substrate contains a top semiconductor layer, a buried insulator layer, and a channel material layer composed of a semiconductor material. A handle substrate would provide mechanical support for the overlying insulator layer and the channel material layer 310. The insulator layer, which in some embodiments may be referred to as a buried insulator layer, may be a crystalline, or non-crystalline, oxide or nitride. In one embodiment, the insulator layer is an oxide such as, for example, silicon dioxide. In an embodiment, a layer transfer process can be used in which wafer bonding is employed. In the layer transfer process, two semiconductor wafers are bonded together. The two wafers used in fabricating an initial structure may include two SOI wafers, wherein one of the wafers includes the first buried insulator layer and the first semiconductor layer and the other wafer includes the second insulator layer; an SOI wafer and a bulk semiconductor wafer; two bulk semiconductor wafers, etc.

After processing the semiconductor substrate as described above, a gate stack 303 of the NC-FET 300 is formed on the surface of the semiconductor substrate. The gate stack includes at least a gate dielectric layer 315 and an overlying gate conductor 320 and can be formed by deposition of various material layers, lithography and etching. Alternatively, a replacement gate process can be used in forming the gate stack. The gate dielectric 315 of gate stack includes any suitable dielectric material, including but not limited to silicon oxide, silicon nitride, silicon oxynitride, high-k materials, or any combination of these materials.

In another embodiment of the invention, the gate dielectric layer 315 can be comprised of a high k gate dielectric. The term "high k" when referring to gate dielectric 315 denotes any dielectric metal oxide having a dielectric constant that is greater than the dielectric constant of silicon oxide, e.g., 3.9. Typically, the high k gate dielectric that can be employed as gate dielectric 315 has a dielectric constant greater than 4.0, with a dielectric constant of greater than 8.0 being even more typical. Exemplary high k dielectric materials include, but are not limited to: metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

In yet another embodiment of the invention, the gate dielectric layer includes a multilayered stack of a semiconductor-containing gate dielectric, e.g., silicon oxide, and a high k gate dielectric, e.g., hafnium oxide.

Notwithstanding the type of gate dielectric material employed, the gate dielectric 315 can be formed by deposition methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. Alternatively, the gate dielectric layer 315 can be formed by a thermal process such as, for example, thermal oxidation and/or thermal nitridation. In some embodiments of the invention, the gate dielectric layer can be formed utilizing a combination of thermal processing and deposition.

The thickness of the gate dielectric layer 315 may vary depending on the technique used to form the same, as well as the type and/or number of gate dielectric materials employed. Typically, however, the gate dielectric 315 has a thickness from 0.5 nm to 10 nm, with a thickness from 1.0 nm to 5 nm being more typical. When the gate dielectric layer 315 is a high k gate dielectric material, the high k gate dielectric material may have an effective oxide thickness on the order of, or less than, 2 nm.

In FIG. 8A, 8B, both the gate conductor 320 and the gate dielectric 315 are patterned. The patterning is achieved by lithography and etching. Conventional complementary metal oxide semiconductor processing steps that are well known to those skilled in the art can then be used to deposit or thermally grow a gate dielectric 315 and, then deposit and pattern the gate conductor 320.

The gate conductor 320 of gate stack 303 illustrated in FIGS. 8A-8H comprises any suitable conducting material, including but not limited to: doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor 320 and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The thickness of the gate conductor 320 may vary depending on the technique used to form the same, as well as the type and/or number of gate conductor materials employed. Typically, however, the gate conductor 320 has a thickness from 5 nm to 150 nm, with a thickness from 20 nm to 50 nm being more typical. Gate conductor 320 forms one terminal of the ferroelectric capacitor 152 of FIG. 4.

Additionally, as part of the gate stack, formed a top the metal gate conductor 320 is a cap dielectric layer 345 which is formed according to a conventional self-aligned contact (SAC) flow. This layer provides the ability to land the subsequent formed contacts much closer or even on top of the gate without creating a short. In some embodiments, a hardmask (not shown) can be located on an upper surface of the gate conductor 320. When present, the hardmask can be composed of an oxide, a nitride, an oxynitride or a multilayered stack thereof. In one embodiment, the hardmask is composed of silicon oxide and/or silicon nitride. The hardmask, can be formed by growing techniques well known to those skilled in the art including thermal oxidation and/or nitridation. Alternatively, the hardmask can be formed by a conventional deposition process including, for example, chemical vapor deposition (CVD), plasma enhanced chemical vapor deposition (PECVD), evaporation, and atomic layer deposition (ALD). The thickness of the hardmask may vary depending on the technique used to form the same, as well as the type and/or number of hardmask materials employed. Typically, however, the hardmask has a thickness from 10 nm to 100 nm, with a thickness from 20 nm to 50 nm being more typical. The cap dielectric layer 345 is optional.

Prior to or after forming the gate stack of the transistor 300, a source region 322 and a drain region 323 are formed into portions of the semiconductor substrate that are at the footprint of the gate stack. The source region and the drain region are formed utilizing any conventional source/drain ion implantation process and can include p-type dopants for pFETs or n-type dopants for nFETs. In one embodiment, ion implantation of dopants (i.e., p-type or n-type dopants) can be performed to provide the source/drain regions. The source/drain regions can be activated immediately after the ion implantation process using activation anneal conditions that are well known to those skilled in the art. Alternatively, the source/drain regions can be activated during a subsequent thermal process. In some embodiments, for example, when a replacement gate process is used in forming the gate stack, the source/drain regions can be formed prior to forming the gate stack. In some embodiments, the source/drain can be formed by in-situ doped epitaxy process.

As mentioned above, the initial NC-FET structure 300 illustrated in FIG. 8A may optionally include at least one spacer 342, 343 located on opposite sidewalls of the gate stack. The optional at least one spacer can be formed prior to, or after, formation of the gate stack 303 utilizing processing techniques well known to those skilled in the art. In one embodiment, the at least one spacer 342, 343 is formed by deposition of a spacer material at exposed sidewalls of the gate stack 303 and etching. The at least one spacer 342, 343 can be composed of an oxide, a nitride and/or an oxynitride. In one embodiment, the at least one spacer 342, 343 can be comprised of a low k dielectric spacer material which has a dielectric constant of less than silicon nitride. Typically, the at least one spacer 342, 343 is comprised of a silicon oxide and/or silicon nitride.

Figure 8C:
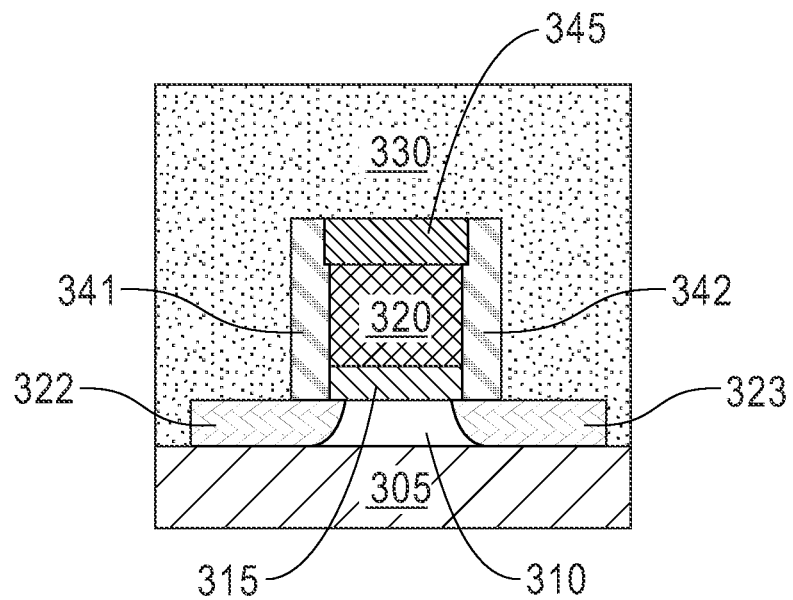
Figure 8D:
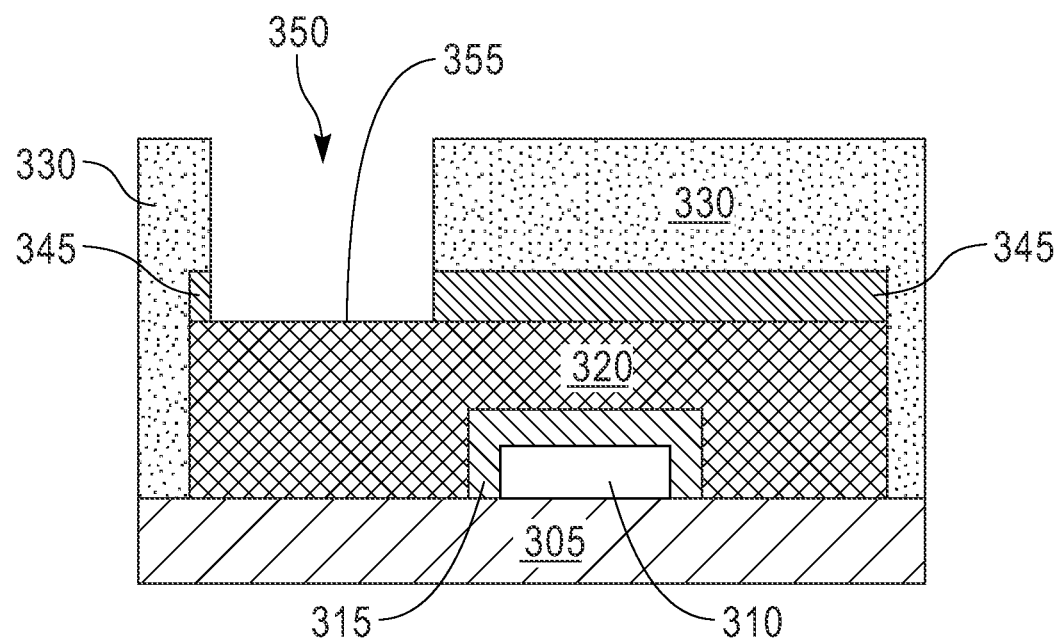

FIGS. 8C and 8D depict respective X-X axis and Y-Y axis cross-sectional views of the resulting structure formed as a result of a further processing step to deposit an interlevel dielectric (ILD) layer 330 surrounding the MOSFET transistor 300 of structure of FIGS. 8A, 8B and the etching of a trench or contact via 350 to form the ferroelectric capacitor (FE).

In particular, in FIGS. 8C-8D, there are illustrated the semiconductor structure of FIGS. 8A-8B after forming an interlevel dielectric (ILD) layer 330 over the source/drain regions 22A, 22B and the gate stack structure. The ILD layer 330 laterally surrounds the gate structure and may include a dielectric material that may be easily planarized. For example, the ILD layer 330 can include a doped silicate glass, an undoped silicate glass (silicon oxide), an organosilicate glass (OSG) or a porous dielectric material. The ILD layer 330 can be formed, for example, by CVD, PVD or spin coating. The ILD layer 330 can be initially formed such that an entirety of the topmost surface of the ILD layer 330 is formed above the topmost surfaces of the sacrificial cap layer of the gate stack (i.e., top surfaces of the sacrificial gate caps 345). The ILD layer 330 can be subsequently planarized, for example, by CMP and/or a recess etch.

The cross-sectional view taken along the Y-Y axis of FIG. 8D, depict the result of additional semiconductor processing steps of patterning masks and etching structures to form a ferroelectric capacitor trench 350 that exposes a top surface 355 of the metal gate conductor shown in the view of FIG. 8B.

That is, in an embodiment, after forming the interlevel dielectric material layer 330, a gate contact opening, e.g., via or trench, is formed into the dielectric material 330 and underlying sacrificial cap layer 345 by a combination of lithographic patterning and anisotropic etching. The lithographic process includes forming a photoresist (not shown) atop the dielectric material 330, exposing the photoresist to a desired pattern of radiation and developing the exposed photoresist utilizing a conventional resist developer. The etching process includes a dry etching process (such as, for example, reactive ion etching, ion beam etching, plasma etching or laser ablation), or a wet chemical etching process that selectively removes the exposed dielectric material 330 selective to the top surface 355 of the metal gate 320. Typically, reactive ion etching is used in providing the contact opening 350. After etching, the photoresist is typically removed utilizing a conventional resist stripping process well known to those skilled in this art.

Figure 8E:
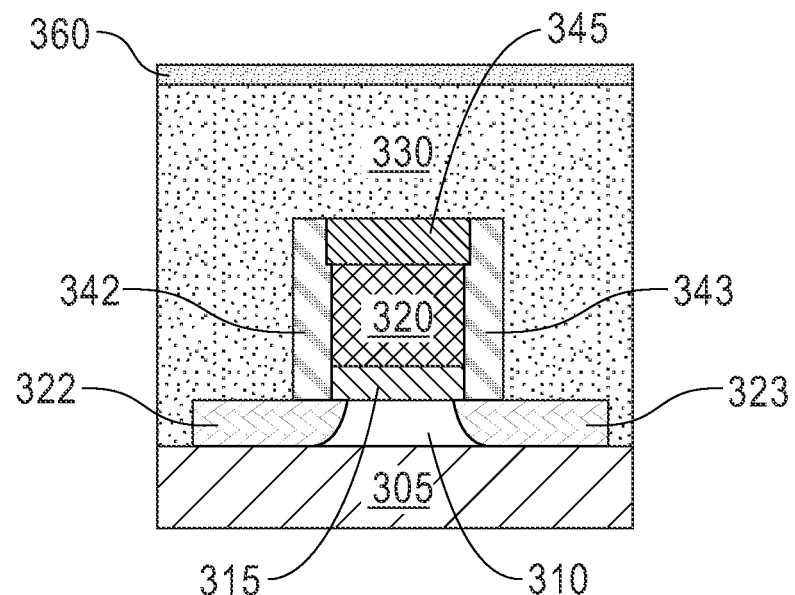
Figure 8F:
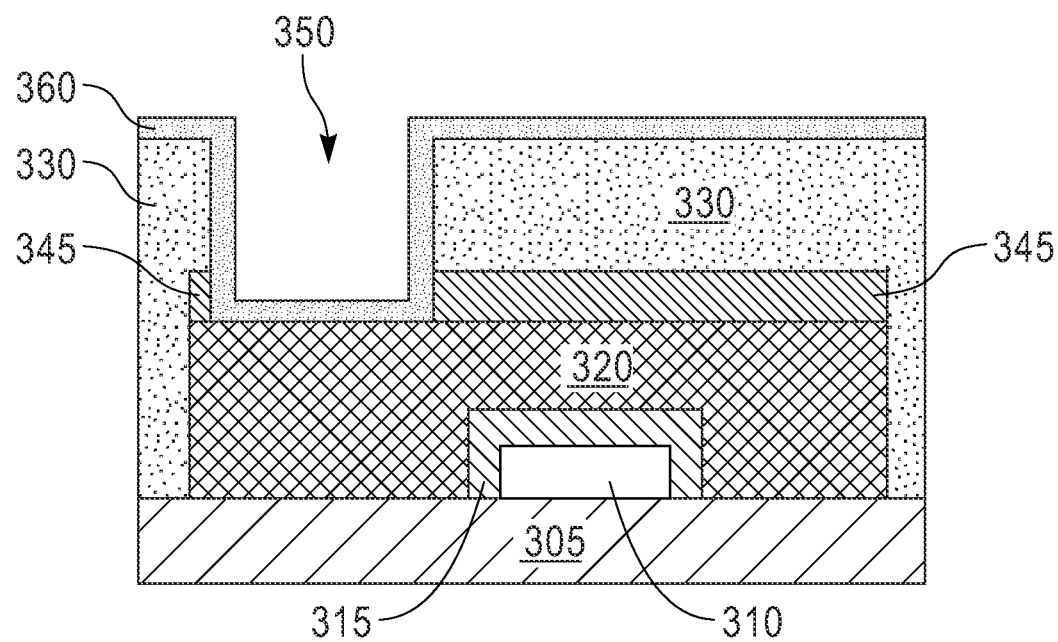

FIGS. 8E and 8F depict respective X-X axis and Y-Y axis cross-sectional views of the resulting structure formed as a result of a further processing step to deposit a layer 360 of ferroelectric dielectric material upon the ILD layer 330 surrounding the MOSFET transistor 300 of structure of FIG. 8C and within the formed trench 350 of FIG. 8D. In an embodiment, the ferroelectric material is HfZrOx or such equivalent. To attain sufficient ferroelectric characteristics, the ferroelectric material film in a ferroelectric capacitor is relatively thick (e.g., on the order of 5 nm or greater, e.g., from 5 nm to 25 nm. The ferroelectric material layer 360 may include any material that generates negative capacitance. Examples of materials that can be used as the ferroelectric material layer 360 include mixed metal oxides such as $BaTiO_3$, $Pb[Zr_xTi_{1-x}]O_3$ ($0 \le x \le 1$), $SrBi_2Ta_2O_9$, and crystalline hafnium oxide with a doping element selected from Zr, Al, Ca, Ce, Dy, Er, Gd, Ge, La, Sc, Si, Sr, Sn, and Y. The ferroelectric material layer 360 may be formed by a deposition process such as, for example, PVD, CVD or ALD.

The cross-sectional view of FIG. 8F taken along the Y-Y axis depicts the resulting structure after this additional step of depositing the layer 360 of ferroelectric dielectric capacitor material within the trench 350 which layer 360 electrically contacts the underlying exposed gate metal of the structure in the view of FIG. 8D and further lines each inner surface sidewall of the trench.

Figure 8G:
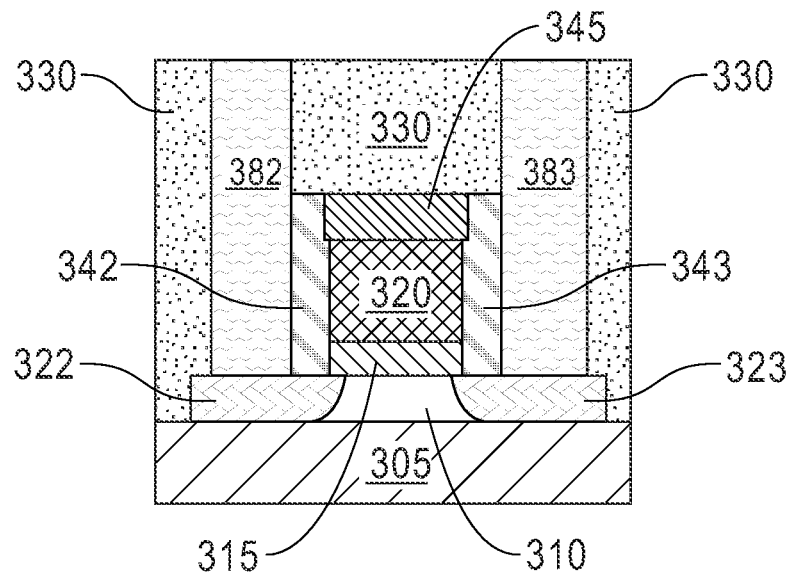
Figure 8H:
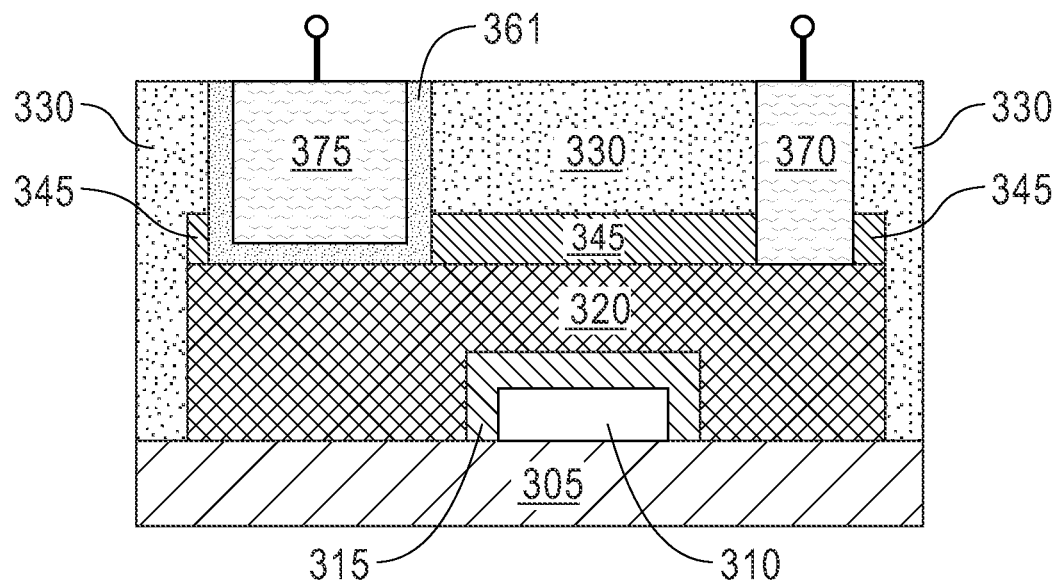

FIGS. 8G and 8H depict respective X-X axis and Y-Y axis cross-sectional views of the resulting structure formed as a result of further processing steps to first planarize the top surface of the structure shown in FIG. 8F, particularly to remove the deposited FE dielectric material layer 360 on top of the structure while leaving a portion 361 of the formed FE dielectric layer 360 along the bottom surface and sidewalls of the trench. FIGS. 8G and 8H further depict the forming of conductive source contact and drain metal contact structures 382 and 383 that contact respective source region and drain region 322, 323 of the NC-FET transistor 300 structure of FIG. 8E.

In the corresponding cross-sectional view of the formed NC-FET transistor 300 of FIG. 8H taken along the Y-Y axis there is further depicted the result of the additional steps of removing the FE dielectric layer 360 at the top of the ILD structure, and the result of additional mask patterning, etching and deposition steps of forming two conductive contacts to the gate metal layer 320 including a first conducting contact 370 that electrically contacts the top surface of the gate metal layer 320 and a second conducting contact 375 filling the trench 350 that is lined with the remaining portion of the FE dielectric material 361 within the trench. FE dielectric material 361 lining the trench is the dielectric layer 161 of the capacitor 152 of FIG. 4. The second conductor contact 375 provides a second or top terminal 162 and the metal gate 320 provides a first or bottom terminal 160 of the ferroelectric capacitor 152 shown in FIG. 4. The resultant structure including the deposited metal contact conductors 370, 375, 382, 383 is then planarized to complete the device fabrication.

In an embodiment, the metal contact fill forming the conductive contacts 370, 375, 382, 383 can be tungsten (W), aluminum (Al), copper (Cu), cobalt (Co), nickel (Ni), titanium (Ti), ruthenium (Ru), molybdenum (Mo), or any other suitable conductive material. The metal contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of the metal contact fill material with the top source drain material, and/or anode/cathode material. In various embodiments, the barrier layer can be deposited in the trench(es) by ALD, CVD, MOCVD, PECVD, or combinations thereof. In various embodiments, the metal fill can be formed by ALD, CVD, and/or PVD to form the electrical contacts. In some embodiment, a planarization process such as chemical mechanical polishing and/or grinding can be used to remove conductive material from atop the upper surface of the dielectric material 330 to provide the structure shown in FIG. 8H.

Figure 9:
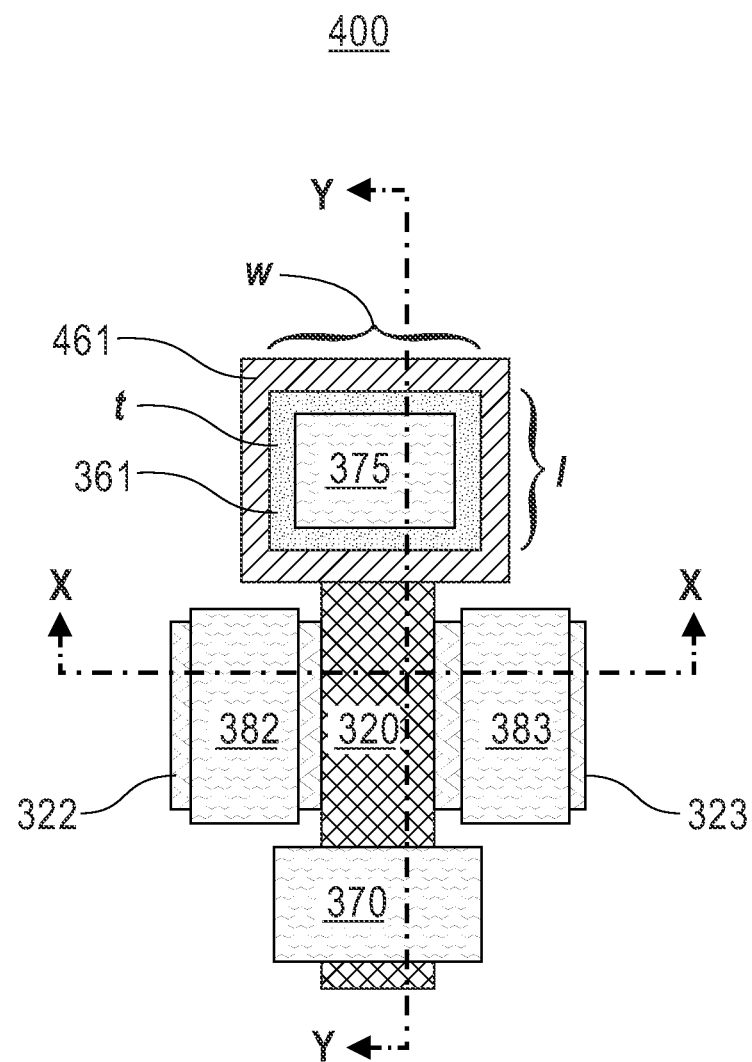
FIG. 9 depicts a top-down view of a second exemplary NC-FET structure that is used to provide the RRAM array forming voltage.

FIG. 9 depicts a top-down view of the NC-FET structure 400 of a second embodiment that is used to provide the RRAM array forming voltage. The NC-FET structure of the second embodiment provides improved flexibility to adjust the ratio between $|C_{FE}|$ and $C_{OX}$. That is, to provide further flexibility, a further metal layer 461 is deposited before the deposition of the ferroelectric dielectric material layer 361 to form a MIM-like FE capacitor so that the capacitance of FE capacitance can be independently tuned by choosing the right height (h), width (w), and length (l) to achieve desired matching between $|C_{FE}|$ and $C_{OX}$. The formed NC-FET structure 400 of the second embodiment includes a NC-FET transistor 300 as in FIG. 7 with gate 320, source terminal contact 322, drain terminal contact 323 on a substrate formed using semiconductor manufacturing techniques as known in the art. In particular, the NC-FET can be formed by standard CMOS flow and then followed by standard middle-of-line (MOL) contact formation which results in the formed source contact 382, drain contact 383, a first gate contact 370 and a second gate contact 375. As shown in FIG. 9, the second gate contact forms a terminal (e.g., plate) of the formed ferroelectric capacitor 152 having a further metal layer 461 deposited before the deposition of the ferroelectric dielectric material layer 361.

FIGS. 10A-10H depict the semiconductor manufacturing steps performed to form the NC-FET 400 of the second embodiment as shown in FIG. 9.

Figure 10A:
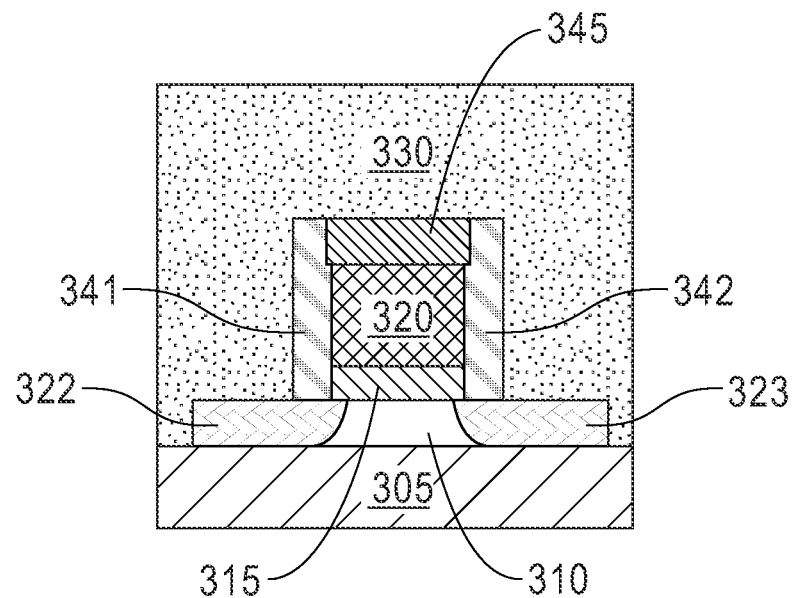
FIGS. 10A-10H depict the semiconductor manufacturing steps performed to form the NC-FET of the first embodiment as shown in FIG. 9.
Figure 10B:
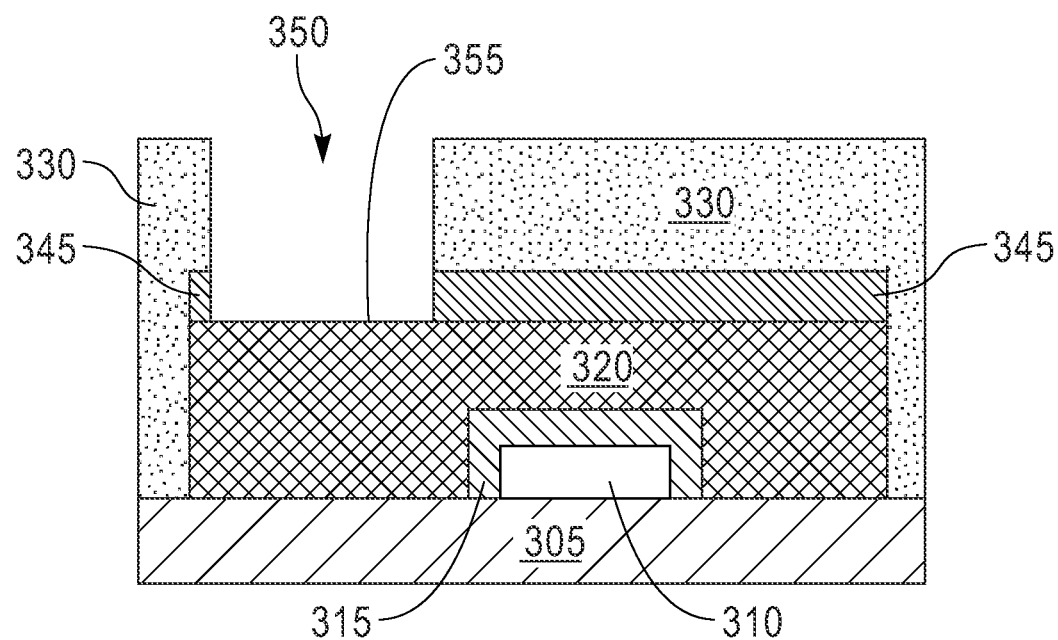

FIGS. 10A and 10B depict respective X-X axis and Y-Y axis cross-sectional views of the resulting identical structure as shown in respective FIGS. 8C and 8D formed as a result of identical semiconductor manufacturing techniques as known in the art. The MOSFET transistor structure of FIG. 10A is the resulting structure after forming on a substrate 305 the channel 310, source contact region 322, drain contact region 323, the gate stack including gate dielectric layer 315, the metal gate terminal 320, the formed SAC cap dielectric layer 345 on top of the metal gate and corresponding formed spacer elements 341, 342, and after depositing and planarizing the top surface of the interlevel dielectric (ILD) layer 330 surrounding the MOSFET transistor 300. FIG. 10B particularly depicts the resulting structure of FIG. 8D after the additional steps of patterning masks and etching structures to form the ferroelectric capacitor (FE) capacitor via or trench 350 that exposes a top surface 355 of the underlying metal gate conductor 320.

Figure 10C:
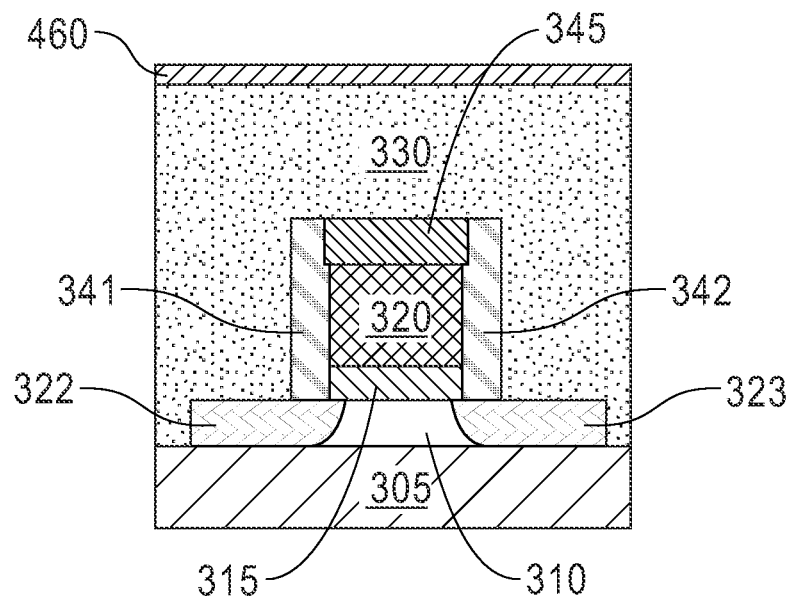
Figure 10D:
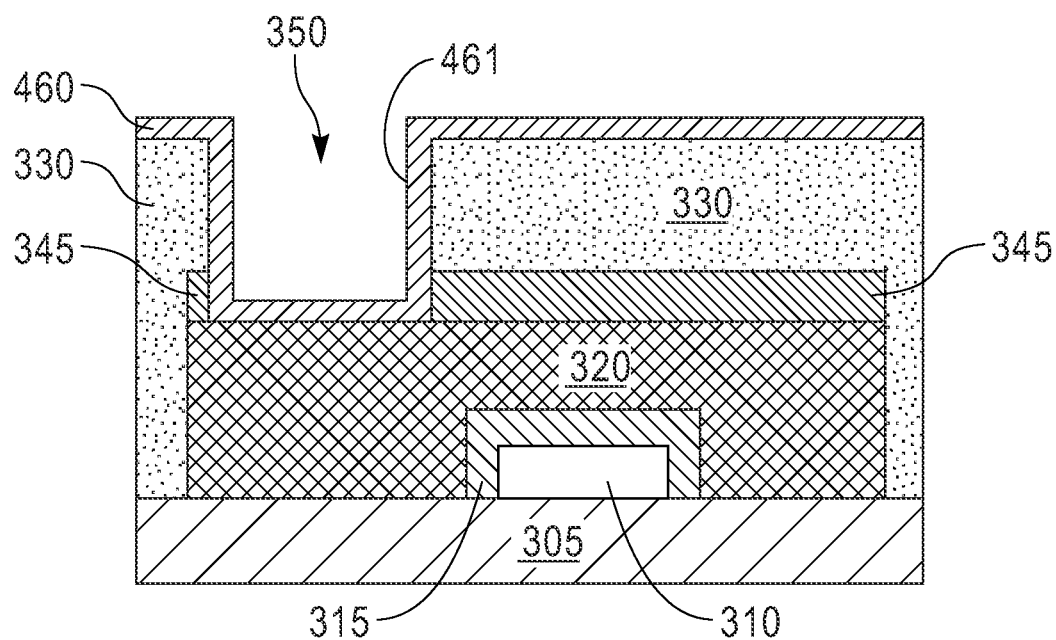

FIG. 10C depicts the resulting NC-FET structure formed as a result of a further processing step to deposit a layer 460 of metal material atop a surface of the ILD layer surrounding the MOSFET transistor and including a portion 461 lining the bottom surface and inner sidewalls of the trench of the structure of FIG. 10A using a conventional deposition process such as, for example, CVD, PECVD, ALD, PEALD, sputtering chemical solution deposition or plating (electro or electroless). In an embodiment, the metal material layer 460 is tungsten, titanium nitride, tantalum nitride, etc. or such equivalent. FIG. 10D shows the corresponding cross-sectional view of the formed MOSFET transistor of FIG. 10B taken along the Y-Y axis. The cross-sectional view of FIG. 10D taken along the Y-Y axis depicts the result of the additional step of depositing the metal material layer 460 atop the ILD dielectric material layer 330 and the metal material layer 461 within the trench that electrically contacts the underlying gate metal within the trench of the structure in the view of FIG. 10B. As shown in FIG. 10D, this metal material layer 461 is of a height dimension "h" such that coupled with length "l" and width "w" dimensions shown in FIG. 9, enable the forming of a MIM-like FE capacitor so that the capacitance of FE capacitance can be independently tuned to achieve a desired matching between $|C_{FE}|$ and $C_{OX}$. The h, l and w dimensions together determine the effective area of the NC capacitor. The area, the ferroelectric material property, and the ferroelectric dielectric thickness, t, together determine capacitance of NC-capacitor, $|C_{FE}|$. The gate dielectric capacitance $C_{OX}$ is determined by the effective gate area, gate dielectric thickness, and the dielectric constant of the gate dielectric material.

Figure 10E:
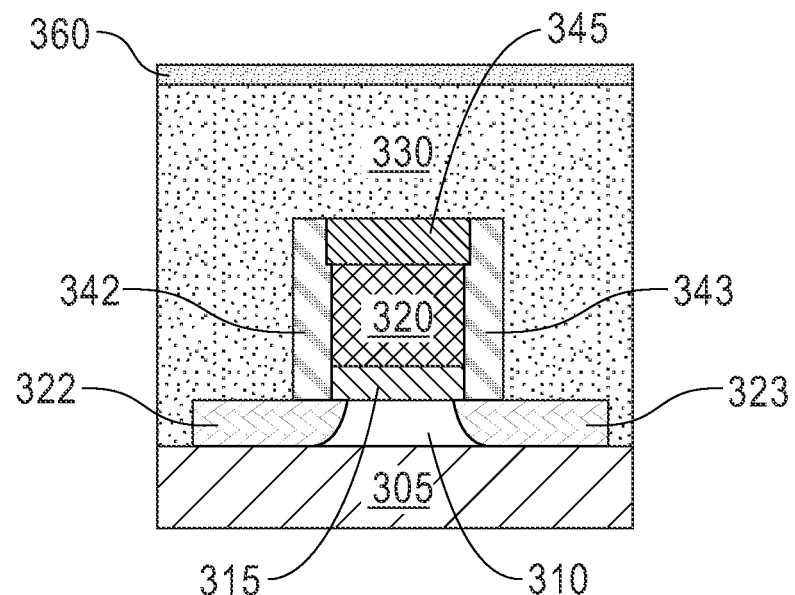
Figure 10F:
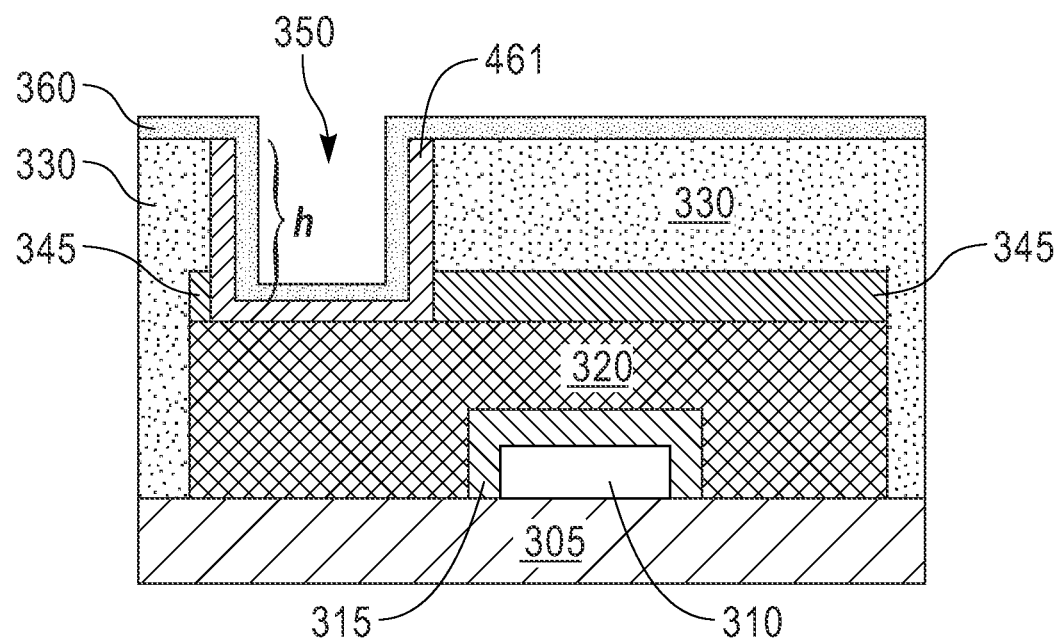

FIGS. 10E and 10F depict respective X-X axis and Y-Y axis cross-sectional views of the resulting structure formed as a result of a further processing step to remove the layer 460 of conductive metal material 460 from the top surface of the ILD 330, while leaving a layer 461 lining the bottom surface and sidewalls of the trench 350. In an embodiment, a planarization process such as chemical mechanical polishing and/or grinding can be used to remove conductive metal material 460 from atop the upper surface of the interlevel dielectric material 330. FIGS. 10E and 10F further show the resulting structure after depositing a layer 360 of ferroelectric dielectric material upon the ILD layer 330 surrounding the MOSFET transistor 400 of FIG. 10C. In an embodiment, the ferroelectric material is HfZrOx or such equivalent. The cross-sectional view of FIG. 10F taken along the Y-Y axis depicts the result of the additional step of depositing the ferroelectric dielectric capacitor material 360 above the metal material layer 461 within the trench 350 to electrically contact metal material layer 350 within the capacitor trench of the structure shown in the view of FIG. 10F. As in FIG. 8F, in an embodiment, the ferroelectric material is HfZrOx or such equivalent. To attain sufficient ferroelectric characteristics, the ferroelectric material film in a ferroelectric capacitor is relatively thick (e.g., on the order of 5 nm or greater.

Figure 10G:
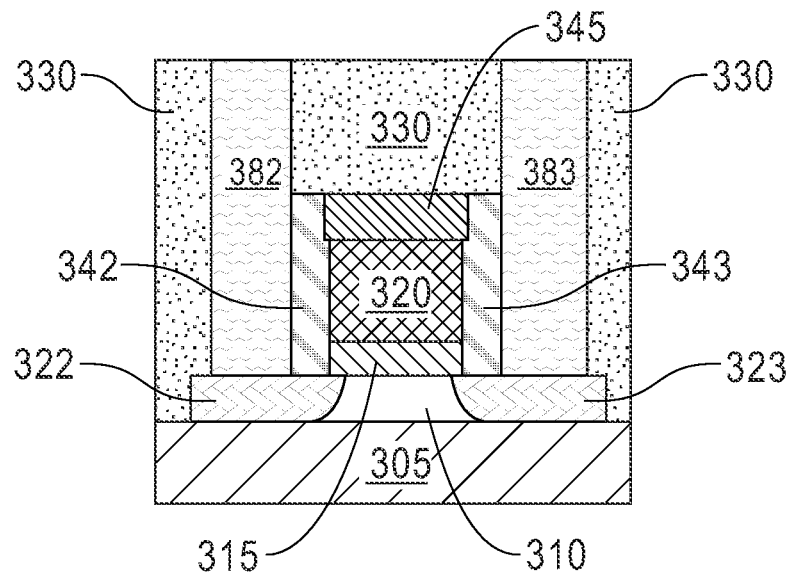
Figure 10H:
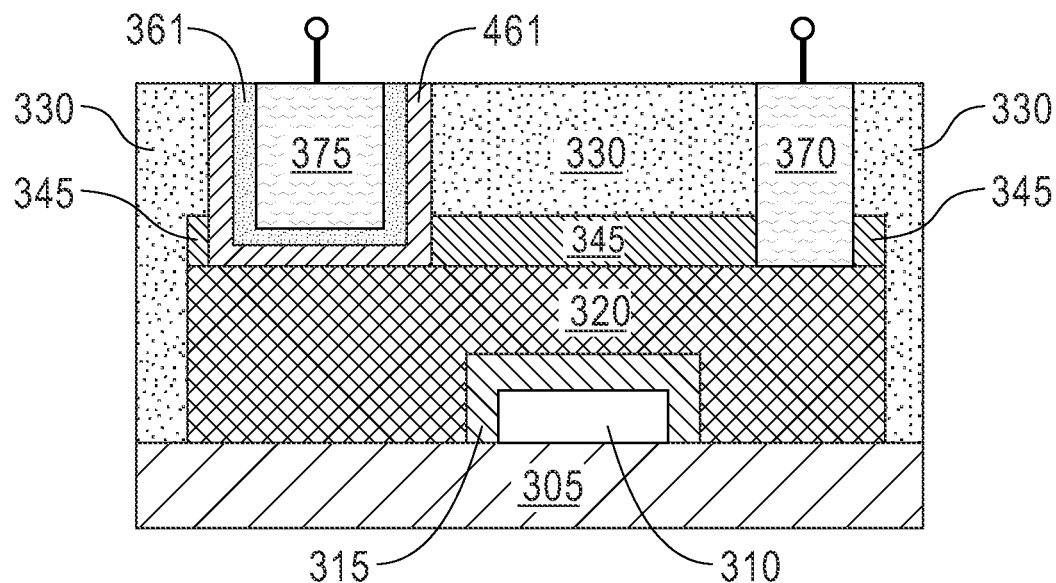

FIGS. 10G and 10H depict respective X-X axis and Y-Y axis cross-sectional views of the resulting structure formed as a result of further processing steps to first planarize the top surface of the structure shown in FIG. 10E to remove the ferroelectric dielectric capacitor material layer 360 deposited on top of the structure while leaving the formed ferroelectric dielectric capacitor material layer 361 above the metal material layer 461 along the bottom and sidewall surfaces of the capacitor trench. FIG. 10G further depicts the resulting structure after forming of conductive source and drain contact structures 382 and 383 that contact respective source region and drain region 322, 323 at the adjacent the channel of the MOSFET transistor 300 structure of FIG. 10. In the cross-sectional view of FIG. 10H taken along the Y-Y axis there is depicted the further result of the additional standard middle-of-line (MOL) contact formation including mask patterning, planarizing and etching and deposition steps for forming conductive contacts to the gate metal layer 320 including the first conducting contact 370 that electrically contacts the gate metal layer and a second conducting contact 375 connecting the inner FE dielectric material layer 361 within the trench. In an embodiment, the second conductor contact 375 provides a second or top plate of a ferroelectric MIM capacitor 390, and the metal gate 320 provides a first or bottom plate of the ferroelectric MIM capacitor 390 that further includes the additional FE dielectric material 361 and metal layer 461 lining the trench. The resultant structure including the deposited contact conductors 370, 375, 382, 383 is then planarized to complete the device fabrication.

In an embodiment, the conductive material that can be employed in forming the conductively filled contacts 370, 375, 382, 383 includes, for example, a metal, e.g., tungsten (W), aluminum (Al), copper (Cu), cobalt (Co), nickel (Ni), titanium (Ti), ruthenium (Ru), molybdenum (Mo), or any other suitable conductive material. The metal contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of the metal contact fill material with the top source drain material, and/or anode/cathode material. In various embodiments, the barrier layer can be deposited in the trench(es) by ALD, CVD, MOCVD, PECVD, or combinations thereof. In various embodiments, the metal fill can be formed by ALD, CVD, and/or PVD to form the electrical contacts. In some embodiments, a planarization process such as chemical mechanical polishing and/or grinding can be used to remove conductive material from atop the upper surface of the dielectric material 330 to provide the structure shown in FIG. 10H.

In addition to the steps of forming the exemplary first and second NC-FET structures according as shown in respective cross-sectional views of FIGS. 8H and 10H corresponding to respective layout views shown in respective FIGS. 7 and 9, additional standard semiconductor processing flow techniques are implemented to build the forming enable FET 135 (of FIG. 1B) and additional conductive structures for connecting the metal gate output terminal 157 of the NC-FET to the memory cell through the formed enable FET. For example, while forming the NC-FET 300 or NC-FET 400 of FIGS. 7 and 9, similar semiconductor manufacturing steps are employed to form the FET 135 of FIG. 1B. In an embodiment, normal back-end-of-line (BEOL) processing can be performed to form multilevel interconnect structures (not shown) for connecting a drain (or source) terminal 139 of FET 145 to each of a plurality of bitlines 116 and for connecting a source (or drain) terminal 157 to the second gate contact 370 of the embodiment of FIG. 8H or 10H. The gate of the forming enable FET transistor 145 can include an electrode or terminal that is connected to any wire or signal line connected to a signal source (not shown) that provides an enable signal that will turn on the FET 145 in order to conduct the forming process voltage to the bitlines when initializing the RRAM memory cells of the memory array. The enable FET can be any suitable metal-oxide-semiconductor (MOS) transistors fabricated by CMOS (complementary MOS) process.

In an embodiment, to increase device performance, the ferroelectric capacitance and gate capacitance should be matched. Thus, in the present application, introducing the ferroelectric material and the metal layer to form the NC-FET having an MIM-capacitor allows easy tuning of the ferroelectric capacitance of the resulting ferroelectric capacitor. For example, as shown in FIG. 9, by modifying, e.g., increasing, the height, length or width of the ferroelectric capacitor at the gate terminal structure, in turn, leads to an increase of the ferroelectric capacitance.

Although shown as a planar transistor, the NC-FET can be another transistor structure such as: a FinFET, nanosheet transistors, nanowire transistors, vertical transistors, etc.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A memory device comprising:
   at least one memory cell;
   a negative capacitance field effect transistor (NC-FET); and
   a switch circuit connecting a gate terminal of the NC-FET to the at least one memory cell.

2. The memory device of claim 1, wherein the memory cell is a resistive memory (ReRAM) element.

3. The memory device of claim 1, wherein the NC-FET comprises:
   a metal-oxide semiconductor field effect transistor (MOSFET) having the gate terminal, the gate terminal comprising a metal material; and
   a ferroelectric capacitor having a ferroelectric dielectric material layer in series with the gate terminal.

4. The memory device of claim 3, wherein an electrode of the ferroelectric capacitor includes an electrode that electrically connects to the gate terminal of the NC-FET.

5. The memory device of claim 3, wherein an electrode of the ferroelectric capacitor comprises the gate terminal of the NC-FET.

6. The memory device of claim 5, wherein the NC-FET further comprises:
   a layer of metal material formed between the ferroelectric dielectric material layer of the ferroelectric capacitor and the gate terminal of the NC-FET.

7. The memory device of claim 5, wherein the switch circuit connecting the gate terminal of the NC-FET to the at least one memory cell is an enable FET.

8. A memory array comprising:
   a plurality of memory cells, each memory cell storing a data value;
   a negative capacitance field effect transistor (NC-FET); and
   a switch circuit connecting a gate terminal of the NC-FET to the plurality of memory cells.

9. The memory array of claim 8, wherein each memory cell is a resistive memory (ReRAM) element.

10. The memory array of claim 8, wherein
    a plurality of wordline conductors, each word line conductor configured to access said one or more memory cells along a row of said array;
    a plurality of bitline conductors, each bitline conductor of said plurality associated with one or more memory cells along a column of said array;
    a wordline conductor and one or more bitline conductors configured to enable access to said one or more memory cells along a row of said array, each accessed memory cell receiving signals for configuring said accessed memory cell to one of: store data in or output data from the accessed memory cell.

11. The memory array of claim 10, wherein the switch circuit connecting the gate terminal of the NC-FET to the plurality of memory cells is an enable FET.

12. The memory array of claim 10, wherein the NC-FET comprises:
    a metal-oxide semiconductor field effect transistor (MOSFET) having a gate terminal comprising a metal, and
    a ferroelectric capacitor having a ferroelectric dielectric material layer in series with the gate terminal.

13. The memory array of claim 12, wherein an electrode of the ferroelectric capacitor comprises the gate terminal of the FET.

14. The memory array of claim 13, wherein the NC-FET further comprises:
a layer of metal material formed between the ferroelectric dielectric material layer and the gate terminal of the NC-FET.

15. The memory array of claim 12, wherein the switch circuit connecting the gate terminal of the NC-FET to the one or more memory cells is an enable FET.

16. A method of operating a memory device, the method comprising:
providing, on a substrate, at least one resistive memory cell configured to store data associated with a resistive state;
generating at a negative capacitance field effect transistor (NC-FET) an amplified voltage signal responsive to a received input voltage; and
conducting said amplified voltage signal from said NC-FET to said at least one resistive memory cell.

17. The method of claim 16, comprising:
configuring the at least one memory cell into a low resistance state responsive to said amplified voltage.

18. The method of claim 16, wherein said conducting said amplified voltage signal from said NC-FET to said at least one resistive memory cell comprises:
controlling a switch circuit to connect a gate terminal of the NC-FET to the at least one memory cell.

19. The method of claim 18, wherein said switching circuit comprises a field effect transistor (FET), said switch circuit controlling comprising: providing a control signal to a gate of said FET to activate said FET to conduct said amplified voltage signal.

20. The method of claim 16, wherein the received voltage is a nominal operating supply voltage.

* * * * *